United States Patent
Ratliff et al.

(10) Patent No.: US 6,765,798 B1
(45) Date of Patent: Jul. 20, 2004

(54) ELECTRONIC THERMAL MANAGEMENT UTILIZING DEVICE WITH DEFLECTABLE, TWO-LEG CONDUCTIVE MEMBER; AND WITH ELASTIC, THERMALLY-CONDUCTIVE MATERIAL THERE BETWEEN

(75) Inventors: William Edward Ratliff, Acton, CA (US); Jacob Leland Sealander, Newhall, CA (US)

(73) Assignee: Curtiss-Wright Controls, Inc., Gastonia, NC (US)

( * ) Notice: Subject to any disclaimer, the term of this patent is extended or adjusted under 35 U.S.C. 154(b) by 0 days.

(21) Appl. No.: 10/465,051

(22) Filed: Jun. 19, 2003

(51) Int. Cl.[7] ................................................. H05K 7/20
(52) U.S. Cl. ...................... 361/704; 361/707; 361/719; 174/16.3; 165/80.3; 165/185
(58) Field of Search ............................... 361/704, 707, 361/709, 713, 715, 719–721; 165/80.3, 185; 174/16.3, 52.1; 257/707, 718, 727

(56) References Cited

U.S. PATENT DOCUMENTS

| | | | |
|---|---|---|---|
| 4,298,904 A | * 11/1981 | Koenig | ........................ 361/720 |
| 4,408,220 A | 10/1983 | Calabro | |
| 4,605,986 A | 8/1986 | Bentz et al. | |
| 4,689,720 A | 8/1987 | Daszkowski | |
| 5,077,638 A | 12/1991 | Andersson et al. | |
| 5,107,330 A | 4/1992 | Dahringer | |
| 5,225,965 A | * 7/1993 | Bailey et al. | ................ 361/704 |
| 5,309,979 A | * 5/1994 | Brauer | ....................... 165/80.2 |
| 5,321,582 A | * 6/1994 | Casperson | ................... 361/713 |
| 5,461,541 A | 10/1995 | Wentland, Jr. et al. | |
| 5,859,764 A | * 1/1999 | Davis et al. | ................ 361/704 |
| 5,896,270 A | 4/1999 | Tsui | |
| 6,081,424 A | 6/2000 | Mach et al. | |
| 6,088,228 A | 7/2000 | Petersen et al. | |
| 6,097,598 A | 8/2000 | Miyahara et al. | |
| 6,212,075 B1 | * 4/2001 | Habing et al. | ............... 361/719 |
| 6,257,328 B1 | 7/2001 | Fujiwara et al. | |
| 6,259,602 B1 | 7/2001 | Malhammar | |
| 6,400,565 B1 | 6/2002 | Shabbir et al. | |
| 6,411,513 B1 | 6/2002 | Bedard | |
| 6,415,612 B1 | 7/2002 | Pokharna et al. | |
| 6,430,049 B1 | 8/2002 | Lai et al. | |
| 6,431,259 B2 | 8/2002 | Hellbruck et al. | |
| 6,437,979 B1 | 8/2002 | Unrein | |
| 6,542,365 B2 | * 4/2003 | Inoue | ......................... 361/699 |
| 2003/0202328 A1 | * 10/2003 | Deeney et al. | ............... 361/719 |
| 2003/0223197 A1 | * 12/2003 | Hulan et al. | ................. 361/719 |

* cited by examiner

*Primary Examiner*—Boris Chervinsky
(74) *Attorney, Agent, or Firm*—Pearne & Gordan LLP

(57) ABSTRACT

A thermal management device is for a electronic apparatus, and includes a thermally conductive member, and elastic and thermally conductive material. The member is for engagement with a heat sinking portion and for conducting thermal energy. The member has two legs that are deflectable relative to each other. The first leg is configured for location proximate to an electronic component and the second leg is configured to extend toward the heat sinking portion. The member has a connecting portion interconnecting the two legs such that thermal energy can travel between the legs, and such that a spacing is provided between the two legs. The elastic and thermally conductive material is located in the spacing between the legs such that the thermal energy can travel from the first leg through the material and to the second leg, and such that the two legs may deflect relative to each other.

21 Claims, 2 Drawing Sheets

ELECTRONIC THERMAL MANAGEMENT UTILIZING DEVICE WITH DEFLECTABLE, TWO-LEG CONDUCTIVE MEMBER; AND WITH ELASTIC, THERMALLY-CONDUCTIVE MATERIAL THERE BETWEEN

FIELD OF THE INVENTION

The present invention relates to management of thermal energy produced by an electronic component of an electronic apparatus, and specifically relates to management of thermal energy via a novel thermal management device.

BACKGROUND OF THE INVENTION

Electronic components, such as semiconductor components, produce thermal energy (i.e., heat) during operation. Typically, the thermal energy is an undesirable by-product, and can be detrimental to operation of an electronic apparatus. As such, excessive thermal energy must be removed. One approach to removing thermal energy is to direct a flow of thermal energy to a heat sink portion of the electronic apparatus. The heat sink may be part of the device chassis, etc. The end result is that thermal energy is moved away from the electronic components that produce the thermal energy and which may be adversely affected by the thermal energy if the thermal energy was allowed to rise to an undesirable level.

One approach to diverting thermal energy utilizes a device that conducts thermal energy. The device is placed with one portion adjacent (e.g., in-contact with) the electronic component, and another portion in contact with a heat sink. Several constructions of such devices are known.

In general, there is a desire to increase the component density with electronic devices. This typically provides for increases in function and speed. However, associated with such increases is often an increase in power density. Accordingly, the task of removing unwanted thermal energy often becomes more difficult. Also, there is often a desire to provide electronic devices to have smaller overall packages. Such a reduction of package size may also provide difficulty concerning removal of unwanted thermal energy. Also, it is often desirable to provide for a particular level of ruggedness for an electronic apparatus.

SUMMARY OF THE INVENTION

In accordance with one aspect, the present invention provides an electronic thermal management device. The device includes a thermally conductive member for engagement with a heat sinking portion of an electronic apparatus and for conducting thermal energy from an electronic component of the electronic apparatus. The thermally conductive member has at least two legs that are deflectable relative to each other. A first one of the legs is configured for location proximate to the electronic component and the second leg is configured to extend toward the heat sinking portion. The thermally conductive member has a connecting portion interconnecting the two legs such that thermal energy can travel from the first leg through the connecting portion to the second leg and such that a spacing is provided between the two legs. The device includes an elastic and thermally conductive material located in the spacing between the two legs such that the thermal energy can travel from the first leg through the elastic and thermally conductive material and to the second leg, and such that the two legs may deflect relative to each other.

In accordance with another aspect, the present invention provides an electronic apparatus that includes an electronic component, a heat sinking portion, and an electronic thermal management device. The device includes a thermally conductive member engaged with the heat sinking portion for conducting thermal energy from the electronic component. The thermally conductive member has at least two legs that are deflectable relative to each other. A first one of the legs is configured for location proximate to the electronic component and the second leg is configured to extend toward the heat sinking portion. The thermally conductive member has a connecting portion interconnecting the two legs such that thermal energy can travel from the first leg through the connecting portion to the second leg and such that a spacing is provided between the two legs. The device includes an elastic and thermally conductive material located in the spacing between the two legs such that the thermal energy can travel from the first leg through the elastic and thermally conductive material to the second leg, and such that the two legs may deflect relative to each other.

In accordance with yet another aspect, the present invention provides a method of providing electronic thermal management. The method includes providing a thermally conductive member that is engaged with a heat sinking portion of an electronic apparatus and that conducts thermal energy from an electronic component of the electronic apparatus. The thermally conductive member has at least two legs that are deflectable relative to each other, with a first one of the legs located proximate to the electronic component and the second leg extending toward the heat sinking portion. The thermally conductive member has a connecting portion interconnecting the two legs such that thermal energy can travel from the first leg through the connecting portion to the second leg and such that a spacing is provided between the two legs. The method includes providing an elastic and thermally conductive material located in the spacing between the two legs such that the thermal energy can travel from the first leg through the elastic and thermally conductive material and to the second leg, and such that the two legs may deflect relative to each other.

BRIEF DESCRIPTION OF THE DRAWINGS

The foregoing and other features and advantages of the present invention will become apparent to those skilled in the art to which the present invention relates upon reading the following description with reference to the accompanying drawings wherein.

DESCRIPTION OF EXAMPLE EMBODIMENTS

Figure 1:
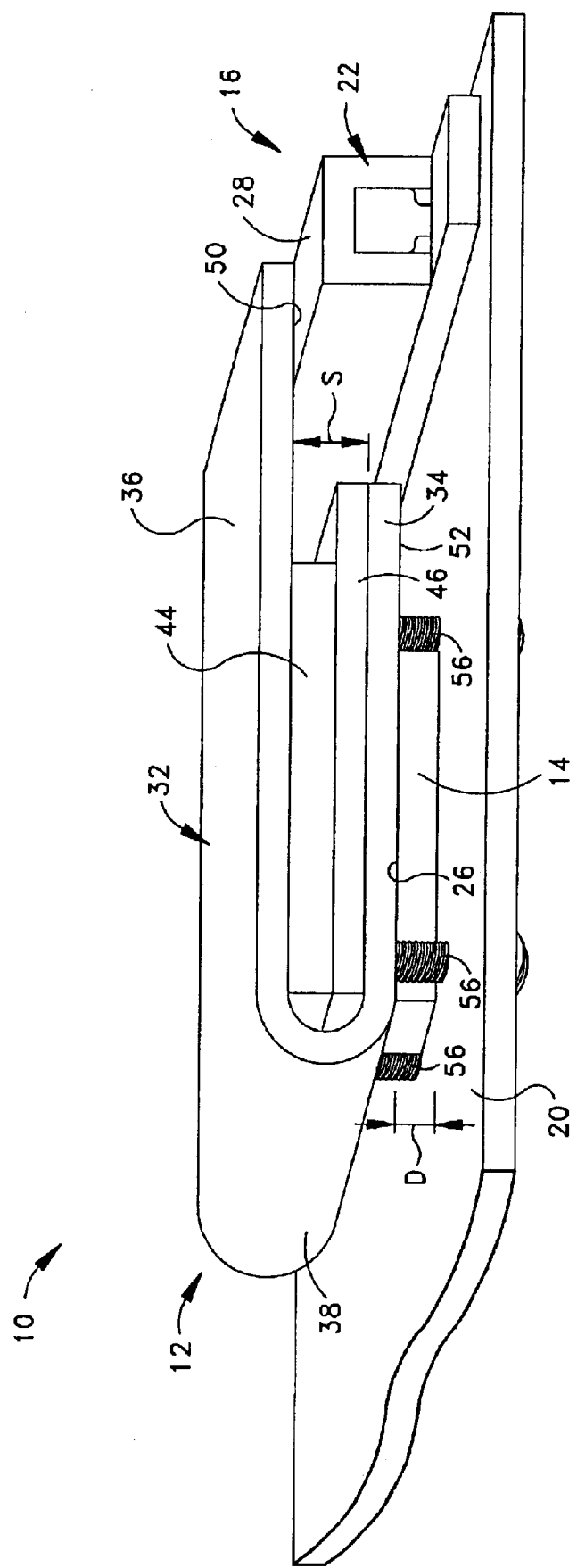
FIG. 1 is an illustration of a portion of an electronic apparatus that includes an example electronic thermal management device in accordance with the present.

A portion of an example of an electronic apparatus 10 that includes an electronic thermal management device 12 in accordance with the present invention is shown in FIG. 1. It is to be appreciated that the electronic apparatus 10 may be any electronic apparatus that has an electronic component 14 that produces thermal energy (i.e., heat) during operation, and a heat sinking portion 16. It is also to be appreciated that the electronic apparatus 10 may include various other portions, components, structures, etc.

In the shown example of FIG. 1, the electronic component 14 is mounted on a boardlike card (e.g., a circuit board) 20.

A card retainer 22 holds the card relative to a chassis (not shown in FIG. 1) of the electronic apparatus 10. It is to be appreciated that, in general, the structure, configuration, orientation, etc. of the electronic component 14, the card 20, the retainer 22, the chassis, and other portions of the electronic apparatus 10 are not limitations on the present invention. However, it is to be noted that the electronic component 14 has a surface 26 (only an edge of the surface is visible) and the retainer 22 has a surface 28. Also, it is to be noted that the electronic component 14 is located generally near to a portion of the heat sink 16, discussed below.

The chassis, the retainer 22, and other components of the electronic apparatus 10 provide the heat sink 16 of the electronic apparatus 10. Specifically, the heat sink 16 functions to receive, transmit, transfer, and/or dissipate thermal energy that is produced at some other portion of the electronic apparatus 10. In the present discussion, the other portion of the electronic apparatus 10 that is producing the thermal energy is the electronic component 14.

Turning to the issue of electronic thermal management, it has been appreciated by the inventors that, in general, increases in thermal conduction are provided by higher thermal conductivity, larger cross-sectional area, shorter thermal travel path length, and a minimization of resistance at a junction from the heat-producing electronic component. It has also been appreciated that materials with high thermal conductivity are expensive. Such high cost is detrimental with regard to cost efficiency of an electronic apparatus. Further, it has also been appreciated that a large cross-sectional area is typically detrimental to minimization of overall package size for the electronic apparatus. Still further, it has been appreciated that a short thermal travel path length may not be logistically practical. In addition, it has been appreciated that minimization of junction resistance is related to maintaining intimate contact with the electronic component. However, maintenance of intimate contact may be difficult due to influences such as manufacturing tolerances. Another issue that the inventors have appreciated is that space constrains, such as those imposed by adjacent structures within the electronic apparatus, may reduce the ability to design for efficient transfer of thermal energy. In short, design considerations facing the inventors often were in conflict.

Turning to the example electronic thermal management device 12 in accordance with the present invention, the device has a member 32 with a general "U" shape. The U-shaped member 32 has first and second legs 34 and 36, and a portion (e.g., a bent portion) 38 that interconnects the two legs. The bent portion 38 is configured such a space "S" exists between the two legs 34, 36.

The member 32 is made of a material that has a relatively high thermal conductivity. In the shown example, the member 32 is made from an elongate, flat plate that is bent to form the bent portion 38, and thus provide the two legs 34, 36. Also, in the shown example, the two legs 34, 36 are of different length. Specifically, the first leg 34 is shorter than the second leg 36. Thus, an end portion of the second leg 36 extends beyond an end portion of the first leg 34. The size (e.g., various dimensions) of the member 32 can be chosen based upon one or more parameters and/or conditions, some of which are discussed below.

Due to the bent configuration and/or the material of the member 32, the legs 34, 36 are able to deflect relative to each other. Specifically, the legs 34, 36 are able to move relative to each other. The movement can be considered to include a pivot movement about the bent portion 38 such that the distance between the legs 34, 36 varies (increase or decease). In general, the member 32 can be considered to be flexible and elastic. The member can be made of any suitable material that provides thermal conductivity and flexibility. For example, a metal, such as copper, aluminum, or an alloy thereof, can be employed.

A flexible, thermally-conductive material 44 is located between the two legs 34, 36. In general, the flexible, conductive material 44 provides for transfer of thermal energy between the legs 34, 36. Also, the flexible nature of the material 44 permits the legs 34, 36 to deflect (i.e., move relative to each other).

In the shown example, the flexible, conductive material 44 is in engagement with only one of the legs (e.g., the second leg 36). Further in the shown example, the flexible, conductive material 44 is dimensioned to fill approximately half of the height of the space S between the two legs 34, 36. A filler material 46, which is thermally conductive, is located between the flexible, conductive material 44 and the other leg (e.g., the first leg 34). Thus, the flexible, conductive material 44 is one material layer and the filler material 46 is another material layer.

The filler material 46 need not be flexible. Of course, the filler material 46 may have some level of flexibility. In the shown example, the filler material 46 is considered to have minimal flexibility compared to the flexible, conductive material 44. It is to be appreciated that it is possible to utilize only the flexible, conductive material 44 such that the flexible material extends to engage both of the two legs 34, 36.

The flexible, conductive material 44 may be any suitable material that provides for thermal conductivity and flexibility. For example, Thermagon, Inc. provides products, such as T-pli™, that are usable as the material. Also, the filler material may be any suitable material that provides for thermal conductivity.

It should be appreciated that although the filler material 46 is shown in the example as a layer, the filler material may be made of the same material (e.g., metal) as the member 38. In one example, the filler material may be integrated into the member 38. As such, the filler material 46 could be formed with, or welded onto, the member 38. Thus, the filler material 46 could be considered to be part of the member 38. This is another example, where the flexible, conductive material 44 can be considered to engage both legs and fill the space between the legs. As such, it is to be understood that the example shown in the figures can be considered to represent a filler made of a different material than the material of the member 38, a filler made of the same material as the member 38, or an arrangement in which the filler is merely part of the first leg of the member 38.

The material (e.g., the flexible material 44, or the flexible material and the filler material 46) between the two legs 34, 36 provides a thermally conductive path that extends directly between the legs 34, 36 and which does not flow through the bent portion 38. The thermal conductive path through the material 44, 46 between the legs 34, 36 provides a shorter path length than the path that extends through the bent portion 38. Also, the material 44, 46 between the two legs 34, 36 permits deflection of the legs, despite the filler material 46 having minimal flexibility.

The second leg 36 of the member 32 is in contact with the retainer 22. For example, a surface 50 (only an edge of the surface is visible) the second leg 36 is against the surface 28 of the retainer 22. It is desirable to have a sufficient amount of contact such that a relatively good thermal conduction pathway from the second leg 36 to the retainer 22 is present. The longer extent of the second leg 36 provides for the second leg to reach the retainer 22. It should be noted that the electronic apparatus 10 may be configured differently such that the second leg 36 is in contact with another portion of the heat sink 16 of the apparatus. The second leg 36 may be attached to the retainer 22 by any suitable means.

The first leg 34 of the member 32 is in contact with the electronic component 14. For example, a surface 52 (only an edge of the surface is visible) of the first leg 34 is against the surface 26 of the electronic component. It is desirable to have a sufficient amount of contact such that a relatively good thermal conduction pathway from the electronic component to the first leg is present.

An adjustment arrangement 56 is provided to maintain the contact between the first leg 34 and the electronic component 14. As such, the adjustment arrangement adjusts the member 32 relative to the electronic component 14. In the shown example, the adjustment arrangement 56 includes a plurality of screws 56 that extend through the card 20 and engage the first leg 34 of the member 32. Further within the example, each screw 56 has a portion (e.g., a head, barely visible) which can be engaged and manipulated to adjust the screw. At the location of each screw 56, the distance "D" between the card 20 and first leg 34 is adjusted/maintained via the screw. Adjustment of the screw 56 adjusts the distance D. As such, the distance between the first leg 34 and the electronic component 14 is maintained via the screw 56. Generally, the distance between the first leg 34 and the electronic component 14 is zero. Thus, the first leg 34 of the member 32 is maintained in contact with the electronic component 14 for transfer of thermal energy from the electronic component to the first leg. In one example, the contact is a slight pressing contact. The adjustment arrangement 56 (e.g., the screws 56) provide an ability to address variations in dimensions. Such dimensional variation may be the result of manufacturing tolerances.

It is to be noted that the deflection of the legs 34, 36 permits the first leg 34 to be moved as needed to maintain contact with the electronic component 14. Flexing of the flexible material 44 between the legs 34, 36 maintains the path for transfer of thermal energy through the flexible material despite the deflection (i.e., movement) of the first leg relative to the second leg. The elasticity of the legs 34, 36 and the flexible material 44 provides a good ability to maintain a contact pressure against the electronic component 14. The maintenance of pressure is useful if the electronic device 10 is subject to movement or vibration, and is also useful upon the occurrence of a thermal expansion/contraction of the various portions (e.g., the electronic component 14) of the electronic device.

Figure 2:
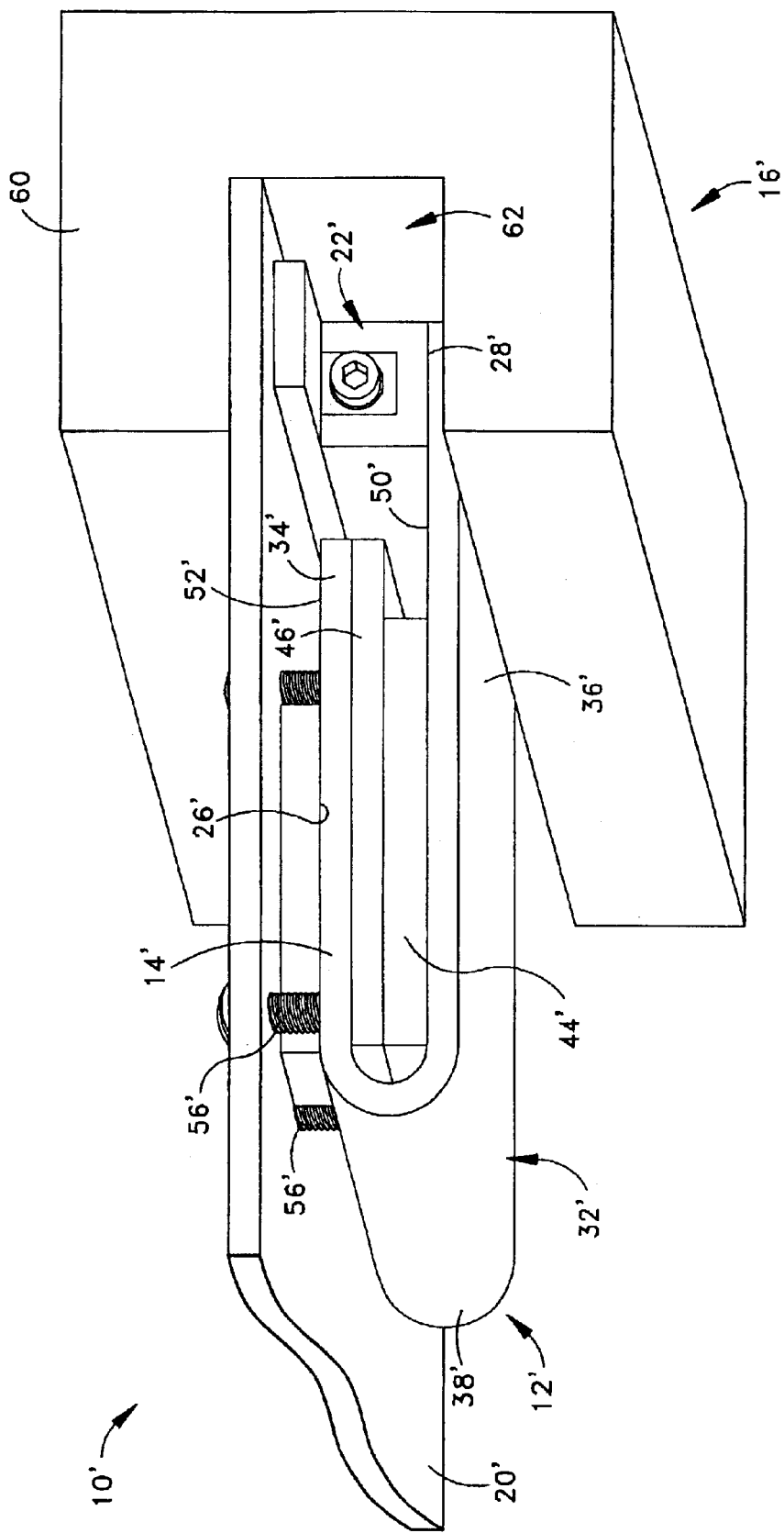
FIG. 2 is an illustration of a portion of another electronic apparatus that includes another example electronic thermal management device in accordance with the present.

A portion of another electronic apparatus 10' that includes another example electronic thermal management device 12' is shown in FIG. 2. Structures that are identical or substantially similar to corresponding structures within the embodiment of FIG. 1 are identified with identical reference numeral, but with a "'" (prime) for the embodiment of FIG. 2. A chassis 60 of the electronic device has a channel 62 to receive a portion of the card 20'. The card retainer 22' cooperates with the chassis 60 at the channel 62 to hold the card 20'. The card retainer 22' also cooperates with the chassis 60 at the channel 62 such that the second leg 36' of the member 32' is held against the chassis by the retainer. Thus, a thermal pathway is present directly from the second leg 36' of the member 32' to the heat sink 16' provided via the retainer 22' and the chassis 60.

In general, the electronic thermal management device 12' is very similar to the electronic thermal management device 12 shown in FIG. 1. The member 32' (FIG. 2) has two legs 34', 36' with a space there between. A bend portion 38' interconnects the legs 34', 36', and the legs are relatively deflectable (e.g., movable). A flexible, thermally-conductive material 44' and a thermally-conductive filler material 46' are located in the space between the legs 34', 36'. The adjustment arrangement 56' maintains contact between the electronic component 14' and the first leg 34'. In the shown example, the adjustment arrangement 56' includes a plurality of screws 56'. Adjustment of each screw 56' is via a head of the screw (only some of the screw heads are partially visible).

From the above description of the invention, those skilled in the art will perceive improvements, changes and modifications. Such improvements, changes and modifications within the skill of the art are intended to be covered by the appended claims.

Having described the invention, the following is claimed:

1. An electronic thermal management device including:
   a thermally conductive member for engagement with a heat sinking portion of an electronic apparatus and for conducting thermal energy from an electronic component of the electronic apparatus, the thermally conductive member having at least two legs that are deflectable relative to each other, with a first one of the legs configured for location proximate to the electronic component and the second leg configured to extend toward the heat sinking portion, and the thermally conductive member having a connecting portion interconnecting the two legs such that thermal energy can travel from the first leg through the connecting portion to the second leg and such that a spacing is provided between the two legs; and
   an elastic and thermally conductive material located in the spacing between the two legs such that the thermal energy can travel from the first leg through the elastic and thermally conductive material and to the second leg, and such that the two legs may deflect relative to each other.

2. A device as set forth in claim 1, wherein the member includes a bent portion interconnecting the two legs.

3. A device as set forth in claim 1, wherein the material located in the spacing is provided by first and second layers of materials, the first material layer is elastic and thermally conductive, and the second material layer is thermally conductive.

4. A device as set forth in claim 1, wherein the first leg is configured for pressing contact with a surface of the electronic component.

5. A device as set forth in claim 1, wherein the member is a flat plate bent to a U-shape.

6. A device as set forth in claim 1, including means for adjusting the thermally conductive member relative to the electronic component.

7. A device as set forth in claim 6, wherein the means for adjusting includes screws engaged with the thermally conductive member.

8. An electronic apparatus including:
   an electronic component;
   a heat sinking portion; and
   an electronic thermal management device including:
   a thermally conductive member engaged with the heat sinking portion for conducting thermal energy from the electronic component, the thermally conductive member having at least two legs that are deflectable relative to each other, with a first one of the legs configured for location proximate to the electronic component and the second leg configured to extend toward the heat sinking portion, and the thermally conductive member having a connecting portion interconnecting the two legs such that thermal energy can travel from the first leg through the connecting portion to the second and such that a spacing is provided between the two legs; and an elastic and thermally conductive material located in the spacing between the two legs such that the thermal energy can travel from the first leg through the elastic and thermally conductive material and to the second leg, and such that the two legs may deflect relative to each other.

9. An apparatus as set forth in claim 8, including the means for maintaining the first leg in contact with the electronic component.

10. An apparatus as set forth in claim 9, wherein the means for maintaining the first leg in contact with the electronic component includes an adjustable screw engaged with the first leg.

11. An apparatus as set forth in claim 8, wherein the member includes a bent portion interconnecting the two legs.

12. An apparatus as set forth in claim 8, wherein the material located in the spacing is provided by first and second layers of materials, the first material layer is elastic and thermally conductive, and the second material layer is thermally conductive.

13. An apparatus as set forth in claim 8, wherein the first leg is configured for pressing contact with a surface of the electronic component.

14. An apparatus as set forth in claim 8, including means for adjusting the thermally conductive member relative to the electronic component.

15. An apparatus as set forth in claim 14, wherein the means for adjusting includes screws engaged with the thermally conductive member.

16. A method of providing electronic thermal management, the method including:

providing a thermally conductive member that is engaged with a heat sinking portion of an electronic apparatus and that conducts thermal energy from an electronic component of the electronic apparatus, the thermally conductive member having at least two legs that are deflectable relative to each other, with a first one of the legs located proximate to the electronic component and the second leg extending toward the heat sinking portion, and the thermally conductive member having a connecting portion interconnecting the two legs such that thermal energy can travel from the first leg through the connecting portion to the second leg and such that a spacing is provided between the two legs; and providing an elastic and thermally conductive material located in the spacing between the two legs such that the thermal energy can travel from the first leg through the elastic and thermally conductive material and to the second leg, and such that the two legs may deflect relative to each other.

17. A method as set forth in claim 16, including maintaining the first leg in contact with the electronic component.

18. A method as set forth in claim 17, wherein the step of maintaining the first leg in contact with the electronic component includes adjusting a screw engaged with the first leg.

19. A method as set forth in claim 16, wherein the member includes a bent portion interconnecting the two legs.

20. A method as set forth in claim 16, wherein the step of providing an elastic and thermally conductive material includes provided by first and second layers of materials, the first material layer is elastic and thermally conductive, and the second material layer is thermally conductive.

21. A method as set forth in claim 16, including adjusting the thermally conductive member relative to the electronic component via an adjustment means.

* * * * *